US005537044A

United States Patent [19]
Stahl

[11] Patent Number: 5,537,044
[45] Date of Patent: Jul. 16, 1996

[54] SURGE VOLTAGE GENERATOR FOR PULSING GROUNDED AND UNGROUNDED ELECTRICAL EQUIPMENT

[75] Inventor: George J. Stahl, Severna Park, Md.

[73] Assignee: The United States of America as represented by the Secretary of the Navy, Washington, D.C.

[21] Appl. No.: 312,951

[22] Filed: Sep. 30, 1994

[51] Int. Cl.[6] .................................................. G01R 31/02
[52] U.S. Cl. .......................... 324/511; 324/510; 324/546; 307/107
[58] Field of Search .................................. 324/509, 510, 324/511; 322/37; 361/111; 307/107

[56] References Cited

U.S. PATENT DOCUMENTS

| | | | |
|---|---|---|---|
| 4,843,515 | 6/1989 | Richman | 361/58 |
| 4,868,505 | 9/1989 | Stahl | 324/511 |

Primary Examiner—Steven L. Stephan
Assistant Examiner—Nicholas Ponomarenko
Attorney, Agent, or Firm—Gary G. Borda

[57] ABSTRACT

A coupling circuit receives a high voltage surge wave and injects it into one or more power lines of a single-phase or three-phase power supply circuit, either line-to-line or line-to-ground. The coupling circuit may have a surge coupler including a series connection of a gas tube and a coupling capacitor, and preferably a rectifier, and a shunt resistor for discharging the coupling capacitor. A one-stage or two-stage surge back filter across the power lines protects the power source from the surge wave. Each surge back filter may have series inductors, and shunt surge suppression circuits, which may each include a series combination of a capacitor and a resistor, in parallel with at least one metal-oxide varistor (MOV) or a cluster of MOVs. A grounding suppressor connected from a power line to ground may include gas tubes and/or MOVs, inductors and resistors. Risetime adjusting circuits including resistors and capacitors may be connected between the power lines and/or between the power lines and ground.

17 Claims, 6 Drawing Sheets

SURGE VOLTAGE GENERATOR FOR PULSING GROUNDED AND UNGROUNDED ELECTRICAL EQUIPMENT

STATEMENT OF GOVERNMENT INTEREST

The invention described herein may be manufactured and used by or for the United States Government for government purposes without the payment of any royalties.

BACKGROUND OF THE INVENTION

1. Field of the Invention

The invention relates to a high voltage impulse wave generator and more particularly to such a generator for generating the 1.2×50 test impulse wave specified in DOD-STD-1399 Section 300, IEEE Standard 587-1980, and other standards, to be applied to electrical and electronic equipment supplied by ac or dc power, to determine its vulnerability to lightning and/or switching transients.

2. Background Art

Ungrounded shipboard electrical equipment is subjected to both line-to-line and line-to-ground impulse waves as specified in MIL-STD-1399 Section 300 to test its vulnerability to surge voltages. Existing commercially available surge generators have limitations that render them inadequate to perform these tests. The equipment described herein has the capability of performing surge voltage tests in accordance with U.S. Navy requirements.

Test surges are generated in presently available surge voltage generators by charging a high voltage capacitor to the desired voltage level and then discharging it through a triggered switch such as an ignitron or a spark gap. The test surge waves are applied to equipment operating on ac or dc power lines by series injection or by capacitive coupling.

In the series injection method, the capacitor is discharged into a resistor and air core inductor connected in parallel which are wired in series with the power line. The surge, which is developed across the parallel load, is superimposed on the line voltage with this circuit configuration. The surge energy divides between the input impedance of the equipment under test (EUT) and the power source impedance. The surge width is determined by the component values chosen for the discharge capacitor and the resistor-inductor combination. The impedance of the resistor and inductor is made very low to reduce the effect of the system impedance and the input impedance of the EUT on the surge width. A capacitor of 10 uF or greater is connected across the power line before the parallel load and the EUT. The capacitor presents a low source impedance to the surge and ensures that nearly all of the surge voltage appears across the input of the EUT; it also protects the power line and other equipment operating on it from the surge.

There are several difficulties in the series injection method. The series inductor carries line current continuously; hence, its wire gauge must be selected accordingly. In instances where the load draws hundreds of amperes, the inductor will be quite large and can also cause a phase voltage unbalance in three-phase power systems that could be substantial in 400 Hz applications. Inductors would have to be added in the other two phases to reestablish voltage balance. A high line voltage drop would also occur depending on the inductor value. Since the surge voltage is superimposed on the line voltage, it will exceed a preset peak voltage at the 240° point in one phase when applied at the zero-crossing in another phase. Furthermore, line-to-ground surges cannot be generated with this method.

Voltage surges are also applied to power lines through coupling capacitors. This method is applicable where the power lines can operate normally with the coupling capacitor connected across them. However, as in the series injection method, the surge voltage is superimposed on the line voltage and will exceed a preset peak voltage at the 240° point in one phase of a three-phase power system when applied at the zero-crossing in another phase. Also, methods do not now exist for performing line-to-ground surge voltage tests on equipment operating on ungrounded power systems such as are found aboard U.S. Navy ships. Moreover, reasonably priced, compact surge back filters to provide protection for the power source when conducting surge tests are not available.

These problems are addressed in part by the surge voltage generator described by the present inventor in U.S. Pat. No. 4,868,505, the disclosures of which are incorporated by reference herein. The generator of the '505 patent gives excellent results, particularly with 115–125 Vac, 60 Hz, single phase electrical equipment. However, there is a continuing need for additional and more flexible types of surge voltage generators which are applicable to a wider variety of electrical systems.

SUMMARY OF THE INVENTION

The surge generator described herein is responsive to these needs. It is capable of generating the 1.2×50, 2500 volt test impulse wave specified in MIL-STD-1399 Section 300 and in other standards. Also described are surge back filters which function to protect the power source from the surge voltage and electrical circuit configurations which enable line-to-ground voltage surges to be applied to equipment operating on ungrounded 115–125, 200 or 440 Vac single- or three-phase, 60 or 400 Hz power lines, such as are found aboard U.S. Navy ships. This impulse wave is used to test the vulnerability of electrical equipment to lightning and/or switching transients.

The voltage surge is developed by charging a high voltage capacitor to the specified peak surge voltage and then discharging the capacitor-stored energy through a triggered switch, preferably an ignitron. The surge energy is applied to the electrical power system and equipment under test through a surge coupler which may comprise a rectifier, a gas tube, and a parallel resistor-capacitor combination which are connected in series. The disclosed apparatus enables the same peak voltage to be obtained wherever the impulse is applied along the power line voltage waveform. The impulse is synchronized with the line voltage and can be applied at any point in time along the power line voltage waveform.

According to a central aspect of the invention, a coupling circuit is used for receiving a high voltage surge wave and injecting it into one or more power lines of a single-phase or three-phase power supply circuit. The coupling circuit may be connected in shunt across a pair of power lines, or between one or more power lines and ground. The coupling circuit advantageously comprises a surge coupler which includes a series connection of a gas tube and a coupling capacitor. A rectifier may be arranged for blocking reverse current flow from the surge coupler to the input of the coupling circuit when the surge wave has terminated, and a resistor may be arranged for discharging the coupling capacitor when the surge wave has terminated. The coupling circuit also includes fixed and/or adjustable resistances.

According to another distinct aspect of the invention, a surge back filter is advantageously connected between the coupling circuit and the power source for protecting the power source from the surge wave. It may comprise a series inductor in each power line, and one or more shunt surge suppression circuits. Each surge suppression circuit preferably has a series combination of a capacitor and a resistor, in parallel with at least one metal-oxide varistor (MOV) or a cluster of MOVs. A second series inductor may also be connected in each power line. One or more additional shunt surge suppression circuits may each comprise one or more MOVs.

According to a further independent aspect of the invention, one or more grounding suppressors may be connected between ground and one or more power lines, preferably the one or more power lines to which a high voltage surge wave is applied. Each grounding suppressor may comprise a series combination of a gas tube, an inductor, and an inductor and a resistor in parallel with each other; the series combination being in parallel with an MOV or MOV cluster. An MOV or MOV cluster may be included instead of, or in series with, the gas tube in the grounding suppressor.

In a further aspect of the invention, risetime adjusting circuits, each of which may include a resistor and capacitor in series, may be connected between respective pairs of power lines, or between respective power lines and ground.

Thus, the apparatus herein has at least the following advantages and new features:

1. The surge voltage is applied directly across the power line, hence, it is not superimposed on the line voltage as in the presently used surge generation methods described above. The same peak voltage is attained wherever the surge is applied along the power line voltage waveform.

2. In contrast with the series injection method of surge generation, no line current passes through the impulse waveshaping load, since the voltage surge is applied to the electrical system in shunt instead of in series. This eliminates excessive voltage drops and imbalances which occur when series injection is used in high current applications; especially in 400 Hz power systems.

3. The surge back filters that protect the power source employ varistors instead of capacitors and are consequently much smaller and significantly less costly than presently available surge back filters.

4. This invention includes circuit configurations for performing line-to-ground surge voltage tests on ungrounded power systems. Methods for performing such tests do not presently exist.

5. With this invention, surges of much greater duration than the standard 1.2×50 impulse wave (e.g., a 4×200 impulse wave) can be generated and imposed on an electrical power system. This would be extremely difficult to achieve with the series injection and capacitive coupling methods of surge generation.

6. A means of limiting inrush current is not required as in the capacitive coupling method of surge generation, since very little standby current is drawn by this circuit configuration, due to the gas tube contained in the surge coupler used in this invention.

7. A surge voltage risetime of precisely 1.2 microseconds can be achieved in accordance with existing specifications.

Other objects, features and advantages of the invention will become apparent from the following description of the invention which refers to the accompanying drawings.

DETAILED DESCRIPTION OF EMBODIMENTS OF THE INVENTION

Figure 1:
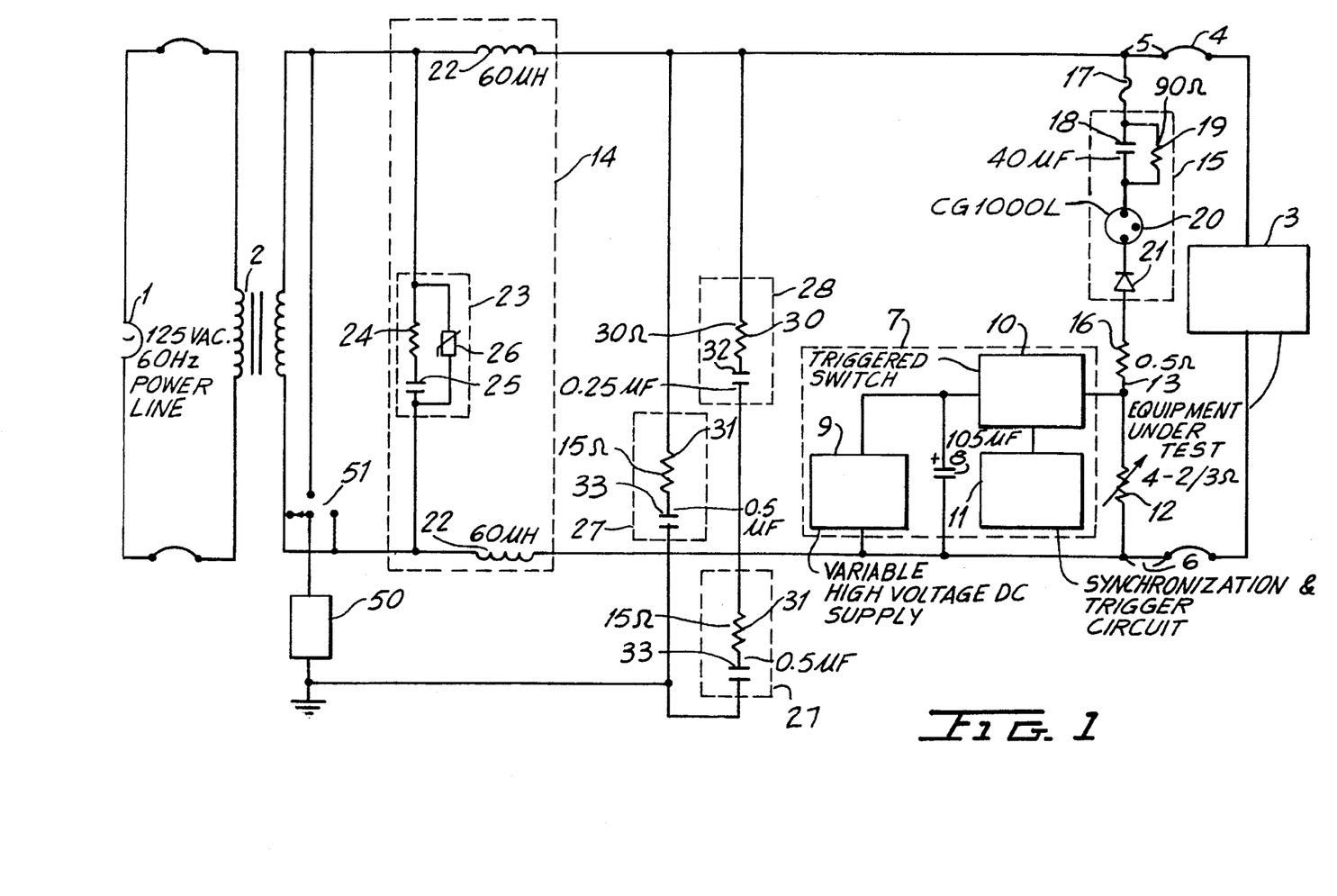
FIG. 1 shows a schematic of a circuit for applying line-to-line high voltage surges to an equipment under test operating on an ungrounded 115–125, 200 or 440 Vac single-phase, 60 or 400 Hz power line.

FIG. 1 shows a schematic of an electrical circuit for testing the vulnerability of ungrounded shipboard equipment to the 2500 volt, 1.2×50 voltage surge specified in MIL-STD-1399, Section 300. The electrical circuit shown is suitable for testing equipment supplied by single-phase, 60 or 400 Hz power lines with system voltages of 115–125, 200, or 440 Vac.

A floating power system is established by decoupling grounded power source 1 via isolation transformer 2.

Before performing surge tests, the equipment under test (EUT) 3 is disconnected from the power line by opening circuit breaker 4 and the voltage surge is applied across terminals 5 and 6 of the power system. This is done to establish the desired open circuit surge voltage waveshape. The voltage surge is observed on an oscilloscope or other viewing instrument to calibrate the surge risetime, peak amplitude, and duration so that these parameters approximate the MIL-STD-1399 surge waveshape as closely as possible. When the optimum waveshape has been established, breaker 4 is closed and surge testing is initiated.

A simplified surge wave generator is represented as 7. Within the surge generator, discharge capacitor 8 is charged to the desired voltage by variable high voltage dc supply 9, which receives its power from the power source 1. A high voltage surge is delivered when the energy stored in capacitor 8 is discharged through triggered switch 10, which can be either an ignitron or a spark gap, for example. An ignitron is preferred because it can be fired over a much wider voltage range than a triggered spark gap. Triggered switch 10 is synchronized by trigger circuit 11, which receives and is responsive to the output waveform of the power source 1, such that the high voltage surge wave can be applied to the EUT 3 at any point along the voltage waveform of power source 1. Surge energy flows from discharge capacitor 8 into variable resistor 12 and current path 13. The value of resistor 12 is varied to adjust the decay time constant of the voltage surge. This compensation is adjusted to account for the effect of power source impedance, which will vary for different power systems, and also for the component tolerances of the discharge capacitor and the circuit elements in surge back filter 14 and surge coupler 15. By increasing or decreasing the resistance value of resistor 12, the width of the voltage surge at the point where it has decayed to one-half of its peak value can be increased or decreased respectively by two or three microseconds.

Circuit path 13 contains a resistor 16, surge coupler 15, and fuse 17, all of which are connected in series as shown. Surge coupler 15 has a coupling capacitor 18 shunted by a resistor 19 both of which are connected in series with a gas tube 20 and rectifier 21. For practical purposes, gas tube 20 is an open circuit since its capacitance is only 1.0 pF at most. Therefore, variable resistor 12, coupling capacitor 18, and the other circuit elements in current path 13 are effectively isolated from the power line until a discharge occurs.

This technique, connecting a coupling capacitor, gas tube and rectifier in series, solves the problems, described above, associated with the capacitive coupling and series injection methods of applying surges to power lines. Since the voltage across coupling capacitor 18 is effectively zero under steady state conditions, the identical peak voltage is obtained wherever the surge voltage is applied along the power line voltage waveform in single-phase or in three-phase applications. This is a significant improvement over both the series injection and presently used capacitive coupling methods where the surge voltage is superimposed on the line voltage waveform. Moreover, due to the isolation provided by the gas tube 20, the capacitance values of discharge capacitor 8 and coupling capacitor 18 can be very high and voltage surges significantly wider than a 1.2×50 surge, e.g., a 4×200 surge voltage, can easily be imposed on a power line.

Gas tube 20 will continue conducting power-follow current from the power line when the surge terminates and could possibly be destroyed unless a means for extinguishing the arc is provided. This function is performed by rectifier 21 when it reverts to the blocking state after the surge current goes through zero and starts to reverse direction. Then, coupling capacitor 18, which charges to about 1900 volts peak during the surge, discharges through resistor 19. In the event of a breakdown in the EUT 3 during surge testing, resistor 16, together with the surge source impedance of discharge capacitor 8 and coupling capacitor 18, limits the discharge current to approximately 3000 amperes as recommended in IEEE standard 587-1980. Fuse 17 protects gas tube 20 and resistors 12, 16 and 19 from line current if rectifier 21 fails shorted. The most preferable type of fuse 17 is a motor starting fuse with a low continuous current rating and the inherent ability to withstand very high surge currents of short duration.

The surge energy flowing through circuit path 13 divides at circuit node 5, respective portions of it flowing toward the power source 1 and into EUT 3, the amount of surge energy absorbed by the EUT being dependent on its input impedance. Most of the energy directed toward the power source flows through surge back filter 14. This unit is comprised of identical inductors 22, one of which is connected in series with each power line, and surge suppression circuit 23. Surge suppression circuit 23 includes resistor 24 and capacitor 25 which are in series and connected directly across the power line at the secondary winding output terminals of transformer 2, and metal-oxide varistor (MOV) cluster 26 which shunts both resistor 24 and capacitor 25. MOV cluster 26 clamps the voltage surge to a reasonably low voltage level, thus protecting the power source 1 from the surge.

Each MOV cluster described herein has at least one, and preferably three or more, individual MOVs of the same voltage rating, connected in parallel to share the surge current and prolong the operating life of these components. Moreover, laboratory experiments have shown that several MOVs connected in parallel have a lower clamping voltage than a single MOV with the same voltage rating. Consequently, additional power source protection is provided by using an MOV cluster in this application. When an MOV first starts to conduct a considerable amount of current, the leading edge of the voltage across the device exhibits an overshoot which can be substantially higher than the clamping voltage itself. Resistor 24 and capacitor 25 eliminate this overshoot and also function to filter the high frequency ringing that occurs at the sudden termination of the open circuit surge voltage undershoot when rectifier 21 shuts off.

The decay time constant of the open circuit surge voltage is dependent on the component values chosen for the discharge capacitor 8, coupling capacitor 18, current limiting resistor 16, and line inductors 22, and also on the impedance of the MOVs in cluster 26 which are selected in accordance with the power line steady-state voltage level. Some minor adjustment of the decay time constant is provided by variable resistor 12 as mentioned before. Shipboard equipment tested for high voltage surge vulnerability can draw current levels up to several hundred amperes from the power line. The voltage drop across surge back filter 14 can therefore be extremely high, especially when the power line frequency is 400 Hz. The value of inductors 22 is therefore made as low as possible to minimize the voltage drop across surge back filter 14 while maintaining the specified open circuit surge voltage waveshape. Off-the-shelf commercial units rated for 60 Hz application have high line voltage drops and can handle line currents up to 100 amperes at most. None are available to test shipboard equipment supplied by 400 Hz power systems. To compensate for the low line inductance values used in surge back filter 14 while preserving the desired surge width, the capacitance values of both discharge capacitor 8 and coupling capacitor 18 are advantageously higher than those found in commercially available voltage surge generators. These higher capacitance values result in a 10×30 short circuit current waveform which is wider than the 8×20 current waveform recommended by IEEE Standard 587-1980. The peak current attained, however, 3000 amperes, is the same as that called for in this IEEE standard. To maintain a constant surge current characteristic, the component values of the current limiting resistor 16 and the discharge and coupling capacitors are fixed. This makes the short circuit current magnitude and waveshape independent of line voltage and of variations in test circuit and EUT configurations.

The MOVs in cluster 26 are rated to handle the power system voltage. For a 115 Vac line voltage, General Electric V130LA20B or V150LA20B devices which have steady-state rms voltage ratings of 130 and 150 Vac respectively can be used. For a 440 Vac line voltage, General Electric V480LA80B or V510LA80B devices with steady-state rms voltage ratings of 480 and 510 Vac respectively are suitable. To obtain the maximum surge suppression at the power source, the MOV with the lower voltage rating is preferred. However, the power line voltage must be carefully tested before making a final MOV selection since power line voltages frequently exceed their nominal voltage levels under transient conditions.

MOVs with high steady-state rms voltage ratings inherently have a higher impedance than MOVs with lower voltage ratings. Therefore, when MOVs of different voltage ratings are installed in cluster 26 in concordance with the existing power line voltage, an appreciable variation in the width of the open circuit surge voltage waveshape occurs. To counterbalance the variation in MOV impedance and maintain the specified waveform width, the value of the two line inductors 22 in surge back filter 14 is changed accordingly. These are the only circuit elements that should be altered in value because as explained above, the values of the discharge capacitor 8 and the coupling capacitor 18 are held constant to fix the short circuit current waveshape.

Risetime circuit 27 determines the risetime of the open circuit line-to-ground voltage waveform; a separate but identical risetime circuit 27 being connected from each line-to-ground. The risetime of the line-to-line open circuit surge voltage waveform is determined by risetime circuit 28 in concert with risetime circuits 27 as explained below. Each risetime circuit shown in FIG. 1 has a resistor and capacitor connected in series. In addition to setting the risetime, these circuits also smooth the leading edges of the line-to-line and line-to-ground surge voltage waveforms by filtering the high frequency oscillations and initial voltage step that result from the breakover of gas tube 20. For the risetime of both the line-to-line and line-to-ground surge voltage waveforms to be the same, the equivalent impedance of risetime circuit 28 in parallel with the equivalent impedances of risetime circuits 27, which effectively are in series across the power line, must equal the impedance of a single risetime circuit 27. This is accomplished by making the resistance value of resistor 30 twice that of resistors 31 and the capacitance value of capacitor 32 one-half that of capacitors 33.

Also shown in FIG. 1 are a suppression circuit 50 and a selector switch 51, which will be described in more detail below.

The electrical circuit shown in FIG. 1 was breadboarded and tested in the laboratory. High voltage line-to-line surges were applied to a 125 Vac, 60 Hz, single-phase power line on the secondary side of the transformer which was floating with respect to building ground. An open circuit surge voltage that closely approximated the waveshape specified in MIL-STD 1399 was obtained. As expected, the identical peak voltage was obtained wherever the surge was applied along the power line voltage waveform.

The following components and nominal component values provided a desired voltage waveshape: discharge capacitor 8, 105 uF; coupling capacitor 18, 40 uF; variable resistor 12, about 5 Ω, current limiting resistor 16, 0.5 Ω; discharge resistor 19, 90 Ω; line inductors 22, 60 uH each; resistor 24 and capacitor 25 in surge suppression circuit 23, 5 Ω and 10 uF respectively; resistor 30 and capacitor 32 in risetime circuit 28, 30 Ω and 0.25 uF respectively; resistors 31 and capacitors 33 in risetime circuits 27, 15 Ω and 0.5 uF respectively; MOV cluster 26, three General Electric V150LA20B varistors connected in parallel; fuse 17, a FRS-R-12 600 volt, 12 ampere time delay current limiting fuse manufactured by McGraw Edison, Bussman Division; gas tube 20, CG1000L manufactured by General Instrument, Clare Division (a CG2-1000L is believed to be preferable but was not available for these tests); rectifier 21, Westinghouse RA6013030. This rectifier has a ten cycle surge current rating of 3900 amperes and a non-repetitive transient peak reverse voltage rating of 3200 volts, ratings which were more than adequate for the laboratory experiments. Surge suppression circuit 23 suppressed the 2500 volt open circuit surge voltage to a maximum peak level of approximately 380 volts across the secondary winding of transformer 2.

Figure 2:
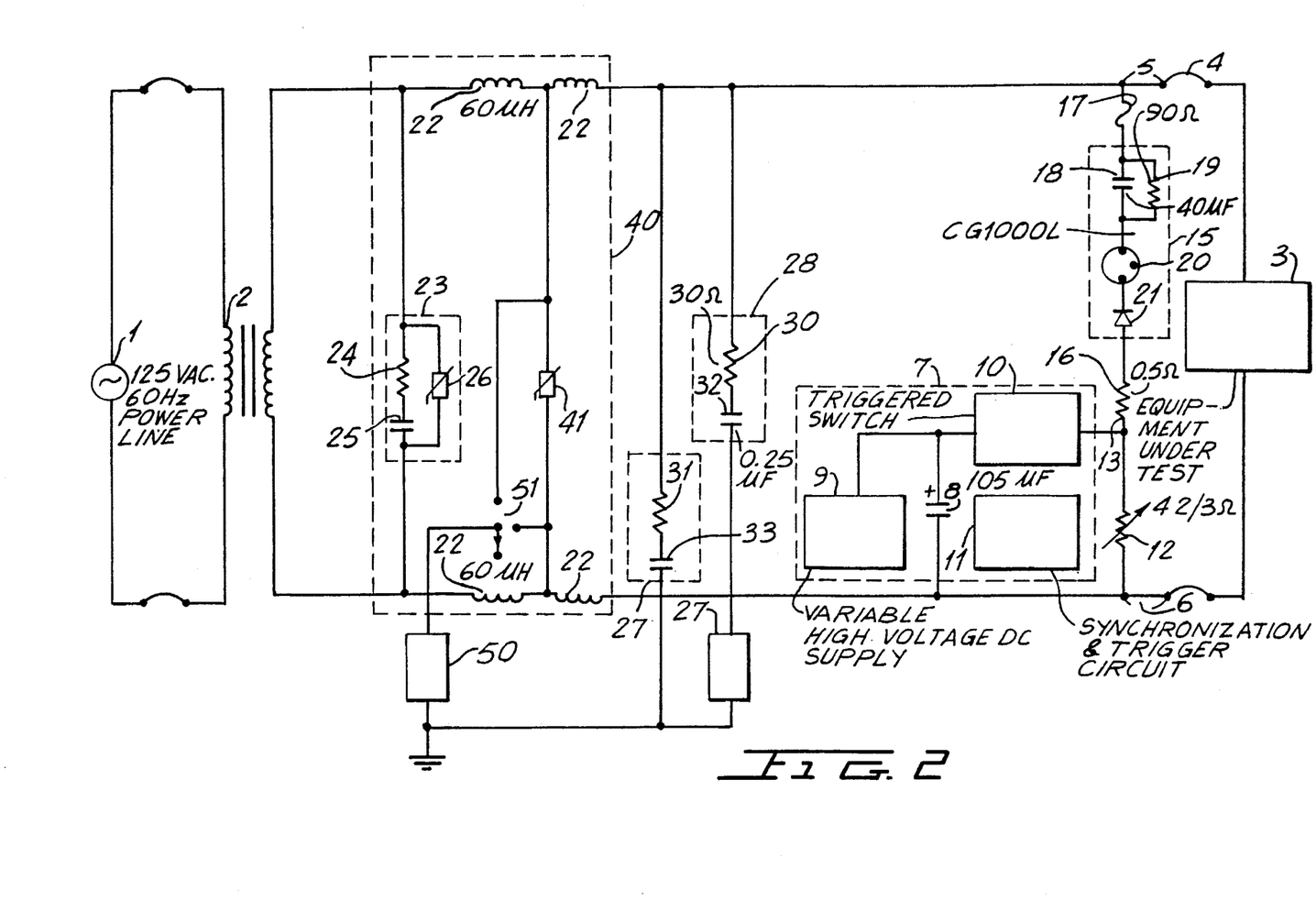
FIG. 2 shows a schematic similar to FIG. 1 and having a two-stage surge back filter to provide additional power source protection.

At low line currents, line voltage drop will be low; therefore, a two-stage surge back filter 40 can be used to effect greater surge voltage reduction at the power source 1, as shown in FIG. 2. A first pair of inductors 22, which are identical in value (60 uH), and an MOV or preferably a cluster 41 of three metal-oxide varistors (MOVs) wired in parallel and connected across the power line as shown, provides the first stage of protection for the power source 1. The second suppression stage is identical to surge suppression circuit 14 in FIG. 1. Also shown in FIG. 2 are a suppression circuit 50 and a selector switch 51, which will be described in more detail below.

Figure 3:
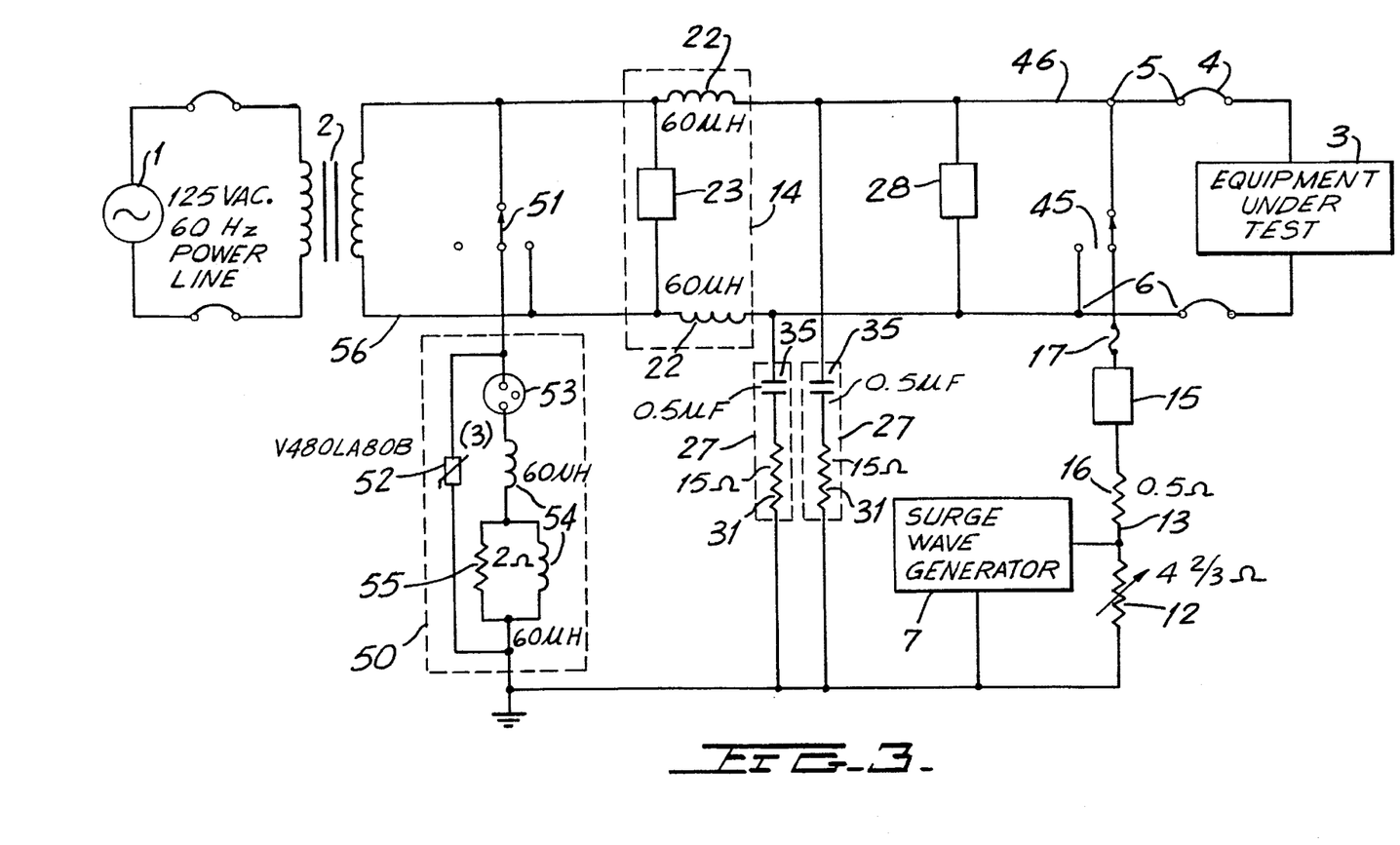
FIG. 3 shows a schematic of a circuit for applying line-to-ground high voltage surges to an equipment under test operating on an ungrounded 115–125, 200 or 440 Vac, single-phase, 60 or 400 Hz power line.

FIG. 3 shows a means of applying line-to-ground voltage surges to an equipment operating on an ungrounded single-phase, 60 or 400 Hz power line. Surges are applied through surge coupler 15 and selector switch 45 which selects the power line to be surged, power line 46 as shown. Line-to-line surge voltage suppression to protect power source 1 is provided by surge suppression circuit 14 which is identical to that shown in FIG. 1.

A single suppression circuit 50 is connected from power line 46 to ground through selector switch 51 to reduce the line-to-ground surge voltage at power source 1 to a low level. Selector switch 51 has an alternate position to connect power line 56 to ground, and a neutral position to disconnect surge suppression circuit 50 from the power lines during line-to-line surge voltage tests. Surge suppression circuit 50 includes a cluster 52 of three V480LA80B MOVs wired in parallel and a gas tube 53 which is connected in series with an inductor 54 and a parallel combination of an identical inductor 54 and a resistor 55. Inductors 54 and resistor 55 are a waveshaping circuit that presents a sufficient impedance to the line-to-ground voltage surge to ensure that the surge voltage width can be maintained at 50 us during this test condition as required. Gas tube 53 is essentially an open circuit and isolates the power line from the waveshaping circuit thus maintaining the floating status of the power system.

When a line-to-ground voltage surge is applied to the power system, gas tube 53 breaks over, creating a circuit path for the surge energy to flow in. The breakdown voltage of a gas tube, however, is relatively high and several microseconds may elapse before the device breaks over, leaving a relatively high voltage, short duration, line-to-ground surge remnant to be passed on to the power source 1. This problem is solved by connecting the cluster 52 of three V480LA80B MOVs wired in parallel across the gas tube and the waveshaping circuit as shown in FIG. 3. MOV cluster 52 conducts much sooner and clamps the surge voltage at a lower level than the gas tube breakover voltage and continues holding the lower voltage until the gas tube finally breaks over.

In suppression circuit 50, the following components and nominal component values yield a desired line-to-ground voltage surge width: gas tube 53, CG300L and CG800L for 115–125 Vac and 440 Vac applications respectively; inductors 54, 60 uH, and resistor 55, 2 ohms, for standard power line voltages ranging from 115 Vac to 440 Vac.

This circuit configuration is perfectly suitable for applying line-to-ground surges to one power line at a time. The gas tube is turned off at the end of the surge when the current returns to 0 amps. However, a gas tube can be kept in its conducting state when connected across a voltage source. Thus, if an identical surge suppression circuit 50 were connected from the other power line 56 to ground and line-to-ground voltage surges were applied to both power lines simultaneously, the gas tubes in each surge suppression circuit 50 would effectively be in series across the power line. They would both break over and effectively present a short circuit across the power line, resulting in the destruction of both gas tubes.

Figure 4:
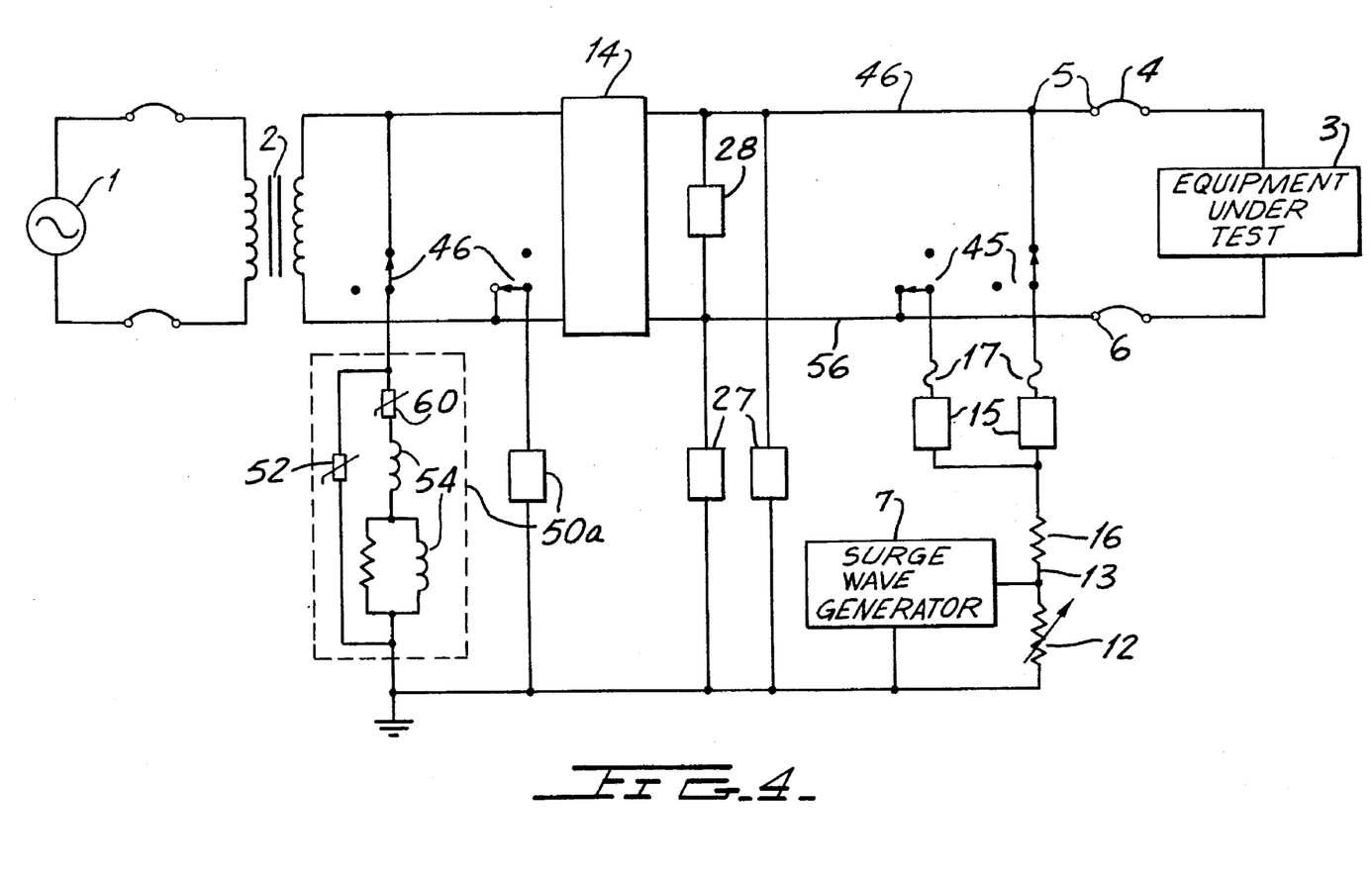
FIG. 4 shows a schematic similar to FIG. 3 in which a gas tube in a line-to-ground suppressor is replaced by an MOV cluster.

This problem is solved by another circuit configuration for applying line-to-ground voltage surges to an ungrounded power system, shown in FIG. 4. In surge suppression circuit 50a, gas tube 53 is replaced by a cluster 60 of three MOVs wired in parallel which have a lower voltage rating than the MOVs contained in MOV cluster 52. The use of MOVs in this configuration enables line-to-ground voltage surges to be applied to power lines individually or simultaneously, without the risk inherent in the circuit in FIG. 3. In order to surge both power lines simultaneously, an additional surge suppression circuit 50a and surge coupler 15 are used as shown in FIG. 4.

Figure 5:
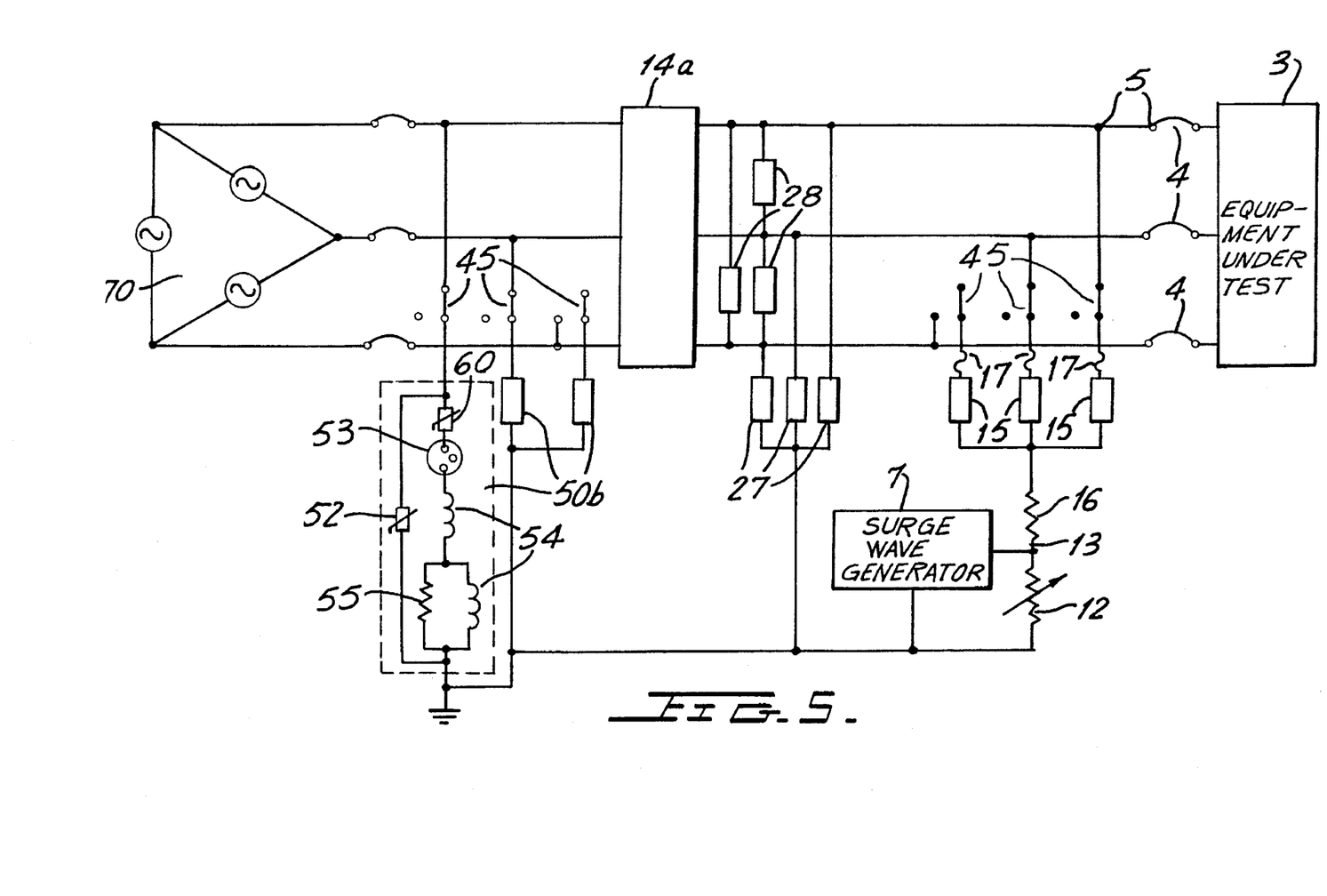
FIG. 5 shows a schematic of a circuit configuration for applying line-to-ground high voltage surges to an equipment under test supplied by a three-phase 440 Vac power source connected in delta.

FIG. 5 shows a circuit configuration for applying line-to-ground voltage surges to an EUT supplied by a three-phase, 440 Vac power source 70 connected in delta. To enable all three power lines to be surged simultaneously, three surge couplers 15, three surge suppression circuits 50b, and six selector switches 45, are used as shown. FIG. 5 shows a surge suppression circuit 50b which contains a CG800L gas tube 53 connected in series with a cluster 60 of three V250LA40B MOVs wired in parallel to prevent the short circuit across the power line that occurs from two gas tubes breaking over simultaneously when two power lines are surged at the same time as described above.

Figure 6:
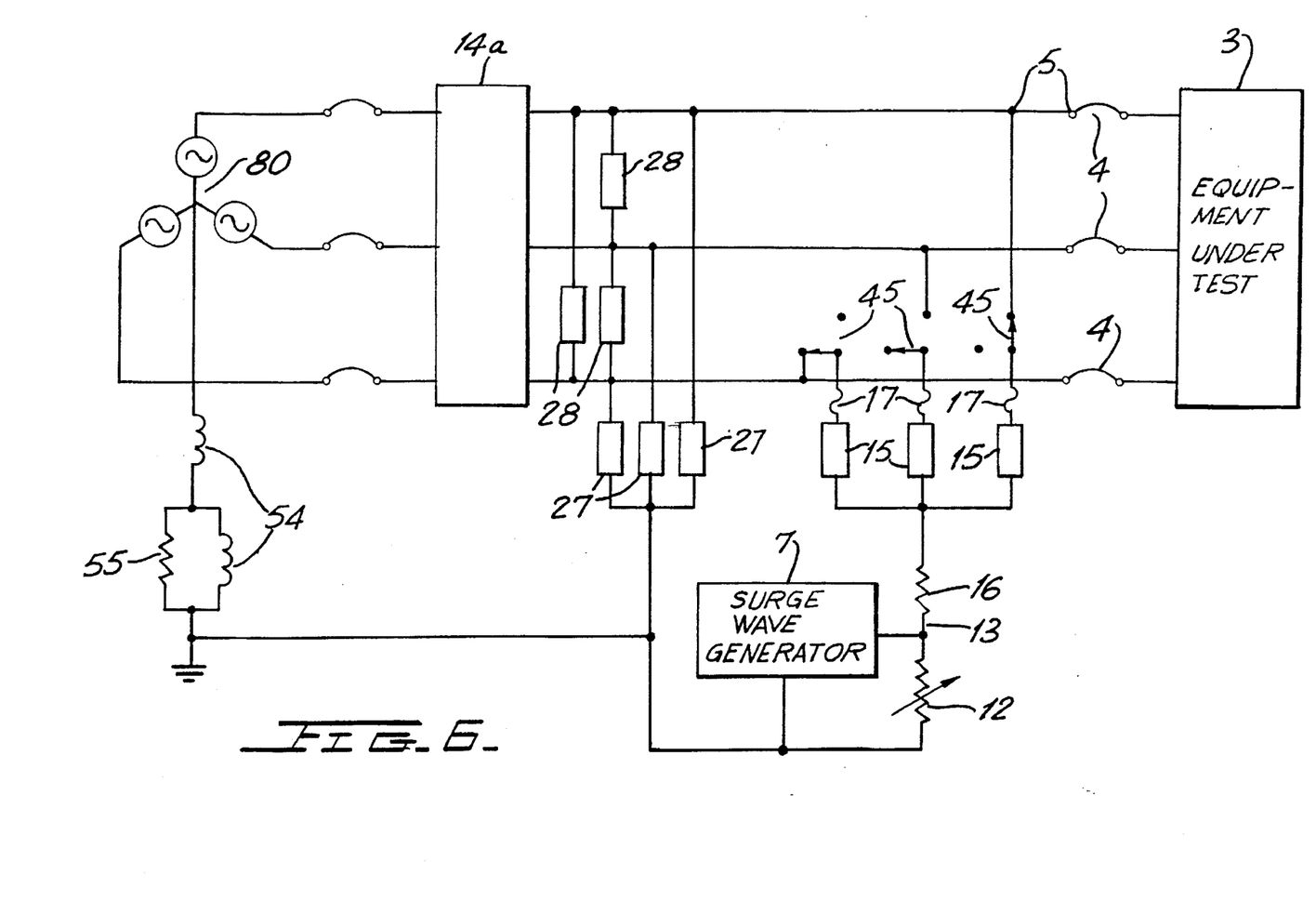
FIG. 6 shows a schematic of a circuit configuration for applying line-to-ground high voltage surges to an equipment under test supplied by a three-phase power source connected in wye with a grounded neutral.

FIG. 6 shows a circuit configuration for applying line-to-ground voltage surges to an EUT supplied by a three-phase 200 Vac power source 80 connected in wye with a grounded neutral such as are found aboard U.S. Navy aircraft carriers. To present a sufficient impedance to the line-to-ground surge voltage to ensure a 50 us surge voltage width as required at this test condition, a waveshaping circuit comprising inductors 54 and resistor 55 is connected between neutral and ground as shown. For a balanced power source connected in wye, little or no current will flow from neutral to ground under normal operating condition; consequently, the voltage drop across the waveshaping circuit will also be very low. The waveshaping network also serves to protect the power source from the voltage surge by becoming an additional leg in a voltage divider for the surge, which includes the inductors 22 in surge back filter 14, the source impedance of power source 80, and the impedance of the waveshaping circuit. The circuit configuration is essentially similar to that shown in FIG. 5 without the surge suppression circuits 50b, which are no longer needed since a ground path for the voltage surge now exists via the power source 80 grounded neutral.

Both FIG. 5 and FIG. 6 show a surge back filter 14a connected to the three power lines of the three-phase system, between the coupling circuit and the electrical power source. Although not shown in detail, the structure of the surge back filter 14a is analogous to that of the surge back filter 14. The surge back filter 14a comprises three series inductors connected respectively in the first, second and third power lines, and three surge suppression circuits connected in shunt across respective pairs of the first, second and third power lines. Each surge suppression circuit comprises a series combination of a capacitor and a resistor, in parallel with at least one MOV, as in surge back filter 14.

Although the present invention has been described in relation to particular embodiments thereof, many other variations and modifications and other uses will become apparent to those skilled in the art. For example, any of the surge suppression circuits 50, 50a and 50b can be used in any of the embodiments disclosed herein. It is preferred, therefore, that the present invention be limited not by the specific disclosure herein, but only by the appended claims.

What is claimed is:

1. An apparatus for generating a shaped high voltage surge waveform to be applied to an equipment under test which is powered by an electrical power source, said apparatus comprising:

first and second power lines for interconnecting first and second inputs of an equipment under test to respective first and second outputs of an electrical power source;

a surge wave generator for generating a high voltage surge wave; and a coupling circuit connected in shunt across said power lines, said coupling circuit having an input which is connected for receiving said high voltage surge wave from said surge wave generator, and having first and second outputs connected to said first and second power lines for supplying said shaped waveform to said equipment under test;

said coupling circuit comprising a surge coupler which is connected between said coupling circuit input and said first coupling circuit output, said coupler comprising a series connection of a gas tube and a coupling capacitor, said gas tube permitting surge energy to flow into said surge coupler in response to said high voltage surge wave, thereby charging said coupling capacitor.

2. An apparatus as in claim 1, wherein said coupler further comprises a rectifier arranged for blocking reverse current flow in a direction toward said coupling circuit input, and away from said gas tube and coupling capacitor, upon termination of said high voltage surge wave.

3. An apparatus as in claim 1, further comprising a surge back filter connected intermediate said coupling circuit and said electrical power source, said surge back filter comprising:

a first pair of series inductors connected respectively in said first and second power lines; and a first surge suppression circuit connected in shunt across said first and second power lines;

wherein said first surge suppression circuit comprises a series combination of a capacitor and a resistor, in parallel with at least one MOV.

4. An apparatus as in claim 3, wherein said surge back filter further comprises a second pair of series inductors connected in series with said first pair of series inductors at a pair of inductor connection points; and a second surge suppression circuit which includes a second MOV or MOV cluster, connected in shunt between said pair of inductor connection points.

5. An apparatus as in claim 1, further comprising a grounding suppressor which is arranged for being connected between ground and at least one of said first and second power lines;

wherein said grounding suppressor comprises a series combination of a gas tube, an inductor, and an inductor and a resistor in parallel with each other; said series combination being in parallel with an MOV or MOV cluster.

6. An apparatus for generating a shaped high voltage surge waveform to be applied to an equipment under test which is powered by an electrical power source, said apparatus comprising:

first and second power lines for interconnecting first and second inputs of an equipment under test to respective first and second outputs of an electrical power source;

a surge wave generator for generating a high voltage surge wave; and a coupling circuit having an input which is connected for receiving said high voltage surge wave from said surge wave generator, and having first and second outputs, said first output being connectable to one of said first and second power lines for supplying said shaped waveform to said equipment under test, said second output being grounded;

said coupling circuit comprising a surge coupler which is connected between said coupling circuit input and said first coupling circuit output, said coupler comprising a series connection of a gas tube and a coupling capacitor, said gas tube permitting surge energy to flow into said surge coupler in response to said high voltage surge wave, thereby charging said coupling capacitor.

7. An apparatus as in claim 6, wherein said coupler further comprises a rectifier arranged for blocking reverse current flow in a direction toward said coupling circuit input, and away from said gas tube and coupling capacitor, upon termination of said high voltage surge wave.

8. An apparatus as in claim 6, further comprising a surge back filter connected intermediate said coupling circuit and said electrical power source, said surge back filter comprising:

a pair of series inductors connected respectively in said first and second power lines; and a surge suppression circuit connected in shunt across said first and second power lines, said surge suppression circuit comprising a series combination of a capacitor and a resistor, in parallel with at least one MOV.

9. An apparatus as in claim 6, further comprising a grounding suppressor which is arranged for being connected between ground and said one of said first and second power lines;

wherein said grounding suppressor comprises a series combination of a gas tube, an inductor, and an inductor and a resistor in parallel with each other; said series combination being in parallel with an MOV or MOV cluster.

10. An apparatus for generating a shaped high voltage surge waveform to be applied to an equipment under test which is powered by an electrical power source, said apparatus comprising:

first and second power lines for interconnecting first and second inputs of an equipment under test to respective first and second outputs of an electrical power source;

a surge wave generator for generating a high voltage surge wave; and a coupling circuit having an input which is connected for receiving said high voltage surge wave from said surge wave generator, and having a pair of first outputs and a second output, each of said pair of said first outputs being connectable to a respective one of said first and second power lines for supplying said shaped waveform to said equipment under test, said second output being grounded;

said coupling circuit comprising a pair of parallel surge couplers which are each connected between said coupling circuit input and a respective one of said first coupling circuit outputs, each said coupler comprising a series connection of a gas tube and a coupling capacitor, said gas tube permitting surge energy to flow into said surge coupler in response to said high voltage surge wave, thereby charging said coupling capacitor.

11. An apparatus as in claim 10, wherein each said coupler further comprises a rectifier arranged for blocking reverse current flow in a direction toward said coupling circuit input, and away from said gas tube and coupling capacitor, upon termination of said high voltage surge wave.

12. An apparatus as in claim 10, further comprising a surge back filter connected intermediate said coupling circuit and said electrical power source, said surge back filter comprising:

a pair of series inductors connected respectively in said first and second power lines; and a surge suppression circuit connected in shunt across said first and second power lines, said surge suppression circuit comprising a series combination of a capacitor and a resistor, in parallel with at least one MOV.

13. An apparatus as in claim 10, further comprising a pair of grounding suppressors which are each connectable between ground and a respective one of said first and second power lines;

wherein each said grounding suppressor comprises a series combination of an MOV or MOV cluster, an inductor, and an inductor and a resistor in parallel with each other; said series combination being in parallel with an MOV or MOV cluster.

14. An apparatus for generating a shaped high voltage surge waveform to be applied to an equipment under test which is powered by a three-phase balanced electrical power source, said apparatus comprising:

first, second and third power lines for interconnecting first, second and third inputs of an equipment under test to respective first, second and third outputs of an electrical power source;

a surge wave generator for generating a high voltage surge wave; and a coupling circuit having an input which is connected for receiving said high voltage surge wave from said surge wave generator, and having three first outputs and a second output, each of said three first outputs being connectable to a respective one of said power lines for supplying said shaped waveform to said equipment under test, said second output being grounded;

said coupling circuit comprising three parallel surge couplers which are each connected between said coupling circuit input and a respective one of said first coupling circuit outputs, each said surge coupler comprising a series connection of a gas tube and a coupling capacitor, said gas tube permitting surge energy to flow into said surge coupler in response to said high voltage surge wave, thereby charging said coupling capacitor.

15. An apparatus as in claim 14, wherein each said coupler further comprises a rectifier arranged for blocking reverse current flow in a direction toward said coupling circuit input, and away from said gas tube and coupling capacitor, upon termination of said high voltage surge wave.

16. An apparatus as in claim 14, further comprising a surge back filter connected intermediate said coupling circuit and said electrical power source, said surge back filter comprising:

three series inductors connected respectively in said first, second and third power lines; and three surge suppression circuits connected in shunt across respective pairs of said first, second and third power lines, each said surge suppression circuit comprising a series combination of a capacitor and a resistor, in parallel with at least one MOV.

17. An apparatus as in claim 14, further comprising three grounding suppressors which are each connectable between ground and a respective one of said first, second and third power lines;

wherein each said grounding suppressor comprises a series combination of an MOV or MOV cluster, a gas tube, an inductor, and an inductor and a resistor in parallel with each other; said series combination being in parallel with an MOV or MOV cluster.

* * * * *